(12) United States Patent
Makishi

(10) Patent No.: US 6,309,460 B1
(45) Date of Patent: Oct. 30, 2001

(54) HAZARDOUS CONTAINMENT FOR MBE MAINTENANCE

(75) Inventor: Todd K. Makishi, Harbor City, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/667,359

(22) Filed: Sep. 21, 2000

(51) Int. Cl.⁷ .................................................... C30B 35/00
(52) U.S. Cl. ............................ 117/200; 117/204; 117/900
(58) Field of Search ................................... 117/200, 204, 117/900

(56) References Cited

U.S. PATENT DOCUMENTS 3,923,379 * 12/1975 Kumada ............................... 350/387

* cited by examiner

Primary Examiner—Felisa Hiteshew
(74) Attorney, Agent, or Firm—Ronald M. Goldman

(57) ABSTRACT

A containment system (1) for use in cleaning of an MBE chamber contains a two part housing in a clam-shell like structure with upper (5) and lower (7) housing sections that are latched together (8) with the walls defining a containment region. The housing is secured to the face of the MBE chamber with the source flange cover of that chamber received through an opening in the rear wall (13 & 19). A closure (28) permits opening or closing a front access opening in the housing through which the containment region may be accessed. The housing includes a exhaust vent tube (11). The containment system includes the means for detecting fire (34) in the confinement region and extinguishing the fires (35) and exhausting any gases through the vent tube.

11 Claims, 4 Drawing Sheets

HAZARDOUS CONTAINMENT FOR MBE MAINTENANCE

FIELD OF THE INVENTION

This invention relates to maintenance of Molecular Beam Epitaxy ("MBE") processing equipment, and, more particularly, to a portable containment system for confining and removing hazardous gases and vapors and extinguishing fires as may arise in cleaning the MBE processing chamber so as to protect personnel from exposure.

BACKGROUND

The molecular beam epitaxy ("MBE") process has been accepted as a preferred fabrication process for the production of Indium Phosphide ("InP") type heterojunction bipolar transistors ("HBT") and high electron mobility transistors ("HEMT"). In that process selected group III and group V elements of the periodic table of elements are heated to vaporization temperatures in respective shuttered fusion cells inside of a vacuum chamber for deposit on a substrate of InP placed within that chamber. The elements that are vaporized at different times typically include Indium, Gallium, arsenic, silicon and phosphorous.

As each element is needed in the fabrication process, a shutter covering the respective heated element, is opened, allowing the vapor of the element, metal or non-metal, to form a beam of molecules of the element that exits the associated fusion cell and spreads into the vacuum chamber. Some of that evaporated material deposits on the InP substrate to build-up epitaxial layers of the material on the substrate, which is the purpose of the process. The materials are evaporated at high temperature and pressure from individual fusion cells inside the chamber, and the hot molecules of the vapor settle on relatively cold surfaces. One by one those reservoirs are uncovered in a defined sequence to create the molecular vapors, and the molecule vapors of each material deposits in sequence on the semiconductor wafer and, unfortunately, on the walls of the chamber. By appropriate control of the fusion cell shutters, the desired layered structure that defines the transistor is ultimately produced. The remainder of the material that was evaporated during the processing, however, settles on the walls of the vacuum chamber, and constitutes the waste or, as otherwise termed, the residue of the MBE process.

Typically, the MBE deposition process continues for long periods. Typically, between four and six months of continuous operation is taken to complete a respective HBT or HEMT transistor structure. Eventually with continued processing, the chemical elements within the fusion cells in the MBE vacuum chamber are depleted, and must be replenished. At that time the heat is turned off, the vacuum chamber is vented to the atmosphere, the chamber door is opened, and the InP substrate removed. The inner walls of the chamber are covered with the residue of the processing. The residue on the chamber wall may comprise chunks or particulate of any and all of the materials vaporized during processing. Two principal ingredients of that residue are particulate arsenic and red phosphorous material.

The access ports to the chamber are opened and the internal chamber walls are scraped and/or abraded of the accumulated solid red phosphorous and arsenic, cleaning the walls. Scraping the chamber walls of those materials creates a potential for exposing maintenance personnel and the laboratory or factory environment to hydride gases and caustic acids in vapor form, recognized as hazardous. This potential gas and acid vapor generation develops predominantly in the event of an ignition and sustained burning of the red phosphorous.

Red phosphor, a metal of an allotropic form referred to as P-4, has quite different chemical properties than arsenic, and different even from the white form of phosphor (e.g. P-2 or white phosphor). Red phosphor is easily ignited by friction, and can burst into flame. Even when the flame is extinguished, the phosphor may continue to smolder, posing a continuing fire danger. Further, one of the products of combustion of the red phosphor when ignited in air is phosphoric pentoxide, a very corrosive gas. Should a fire be detected during cleaning, the chamber must be quickly closed and/or fire retardant applied to the smoldering materials until the fire is extinguished.

To avoid danger to the person, those persons charged with cleaning MBE chambers at present are carefully educated and trained to know what to look for and expect. Those individuals must remain alert and exercise care when cleaning the chamber. Those duties impose an undesirable burden on the individual. In some instances one might foresee that one might fail to visually detect smoldering phosphor, except by inhaling some of the noxious gas produced by the phosphor combustion.

To withstand the high temperature and pressure of the MBE process, the chamber is constructed of stainless steel with thick walls, is very heavy, and is intended to remain in a stationary position within the production facility. To produce InP devices in mass, a production facility typically contains a number of such MBE chambers so that a number of wafers can be processed concurrently.

A containment system constitutes a safety apparatus intended to protect personnel from hazardous gases or material vapors as might be generated in industrial processes by capturing those harmful gases and material vapors at the location of the work and exhausting them to other locations, away from the working personnel, where those noxious gases and vapors may be dissipated harmlessly, detoxified, and/or otherwise and safely handled. To accomplish that function, containment systems typically include a hood and an exhaust conduit, supported in the hood, for connection into an exhaust system or pump that draws gases away from a work area beneath the hood. Often the hood is supported by side and back walls to a work bench at which the personnel work on various workpieces, defining a the three dimensional region or chamber, herein referred to as the confinement region, with a front opening through which personnel may access the work pieces.

In some instances, as in the case of the present invention, a work piece may contain combustible ingredients as might catch fire. The smoke created by the fire is exhausted by the exhaust conduit, but, for the obvious safety of personnel and property, the fire must also be extinguished. Thus containment systems for such kinds of work activity include fire extinguishers.

Those fire extinguishers may be a self-contained portable unit that is universally recognized by the red color. In more sophisticated fire extinguisher systems for this application, liquid fire retardant is pumped through a series of nozzles that are supported in the confinement region and are arranged to direct the fire retardant over the work area to douse the flames. In still more sophisticated fire control systems, ultra-violet and infra-red sensors are used to detect a fire in the confinement region and automatically start the dispensing of fire retardant into the area. The present invention also incorporates such known beneficial features.

Personnel who work with hazardous chemicals at the workbench in research laboratories and industrial facilities in which noxious gases might possibly be generated through unintended combustion of a material have long enjoyed the protection provided by the modern workbench in that industry. Such workbenches are known to contain fume evacuation system, infra-red or ultraviolet fire detection devices and fire extinguishing systems. As an advantage to the present invention brings the foregoing kind of hazard protection to personnel engaged in cleaning of MBE chambers.

Accordingly, an object of the present invention is enhance in the cleaning of MBE chambers.

Another object of the invention is to prevent personnel from being exposed to noxious gases or vapors during cleaning of an MBE chamber.

A further object of the invention is to provide a portable containment system for use when cleaning of an MBE chamber.

A still additional object is to provide apparatus that automatically detects a fire in an MBE chamber and automatically prevents any gases of combustion from escaping into the laboratory or factory.

A still further object of the invention is to confine and prevent any products of combustion as may occur through spontaneous combustion of the phosphor debris removed from the chamber of an MBE processing system from reaching the cleaning technician and to extinguish any such fires automatically.

And an ancillary object of the invention is to provide a containment system design that permits the containment system to be disassembled, moved to another MBE chamber, and reassembled, quickly and easily.

SUMMARY OF THE INVENTION

In accordance with the foregoing objects, the containment system contains a two part housing in a clam-shell like structure with upper and lower housing sections that are latched together and the housing is secured to the face of the MBE chamber with the port cover source flange of that chamber received through an opening in the rear wall. A closure permits opening or closing a front access opening in the housing through which a containment region in the housing may be accessed. Means for detecting fire in the containment region and extinguishing the fires and exhausting any gases through a vent tube in the housing. A table is included to support the housing.

When use on one MBE chamber is completed, the two housing sections may be unlatched, separated and removed from the table. Each of the table and housing sections may be removed to another MBE chamber and reassembled offering enhanced portability.

The foregoing and additional objects and advantages of the invention together with the structure characteristic thereof, which was only briefly summarized in the foregoing passages, will become more apparent to those skilled in the art upon reading the detailed description of a preferred embodiment of the invention, which follows in this specification, taken together with the illustrations thereof presented in the accompanying drawings.

DETAILED DESCRIPTION OF THE PREFERRED EMBODIMENTS

Figure 1:
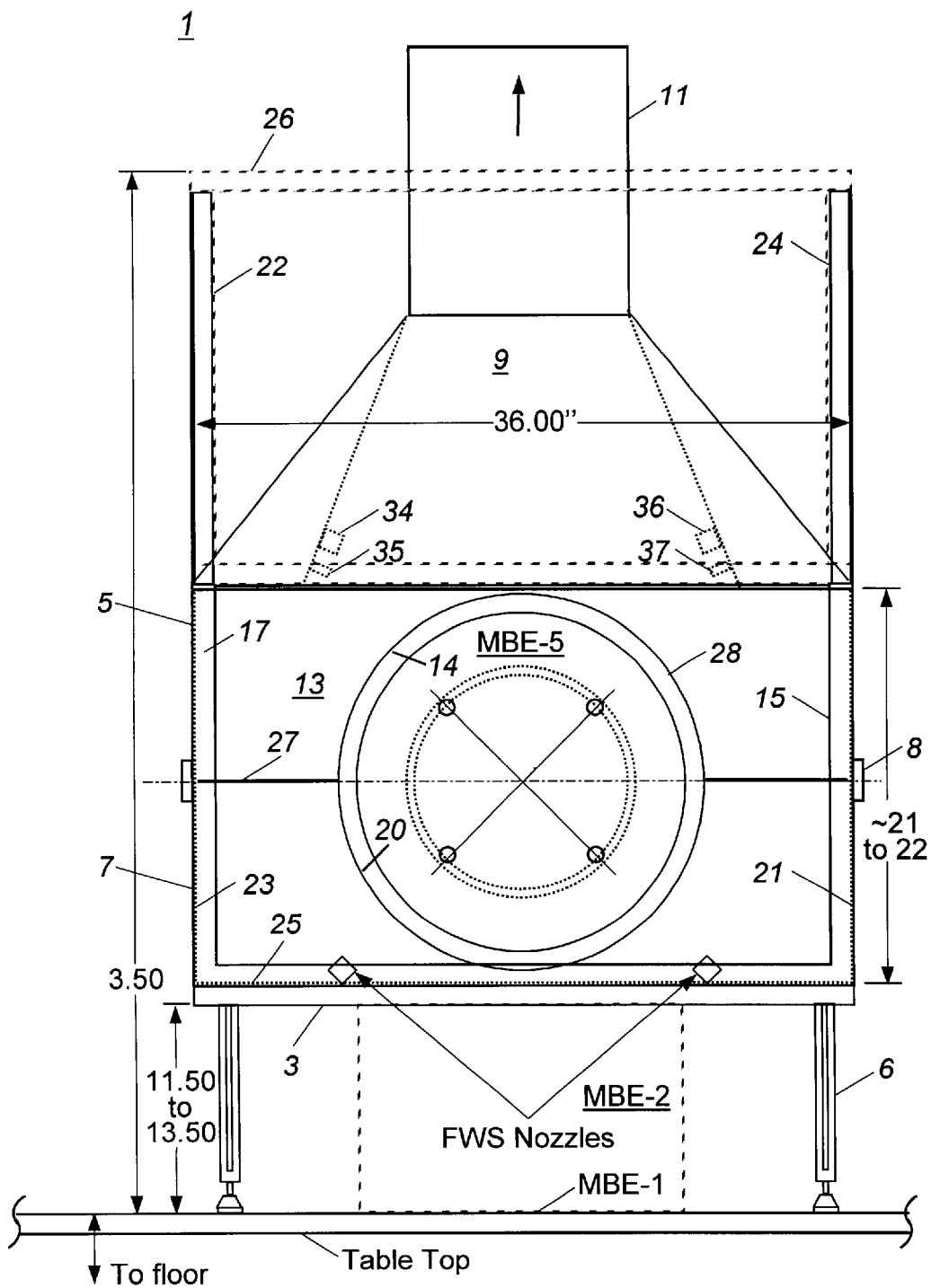
FIG. 1 is an embodiment of the invention in front view.

A front view of an embodiment of a containment system 1 constructed in accordance with the invention is illustrated as assembled for use in FIG. 1 to which reference is made. The system includes a perforated table and sub-plenum 3 and a two-part "clam shell" like housing structure, containing an upper housing section 5 and lower housing section 7. The two sections attach together to form a housing with a front opening defining a confinement region. The housing seats atop the table. It is noted that the table is shown in section in this figure, since the front portion of table 3 and the accompanying front table legs are not illustrated in the figure, to avoid obstruction of the view of the rear table legs.

Upper housing section 5 contains a hood 9, an exhaust conduit 11 that extends upwardly from the hood, a vertical rear wall 13 and vertical right and left hand side walls 15 and 17. The section also contains a rear bracket, not visible in this view, later herein described in connection with FIG. 3. The foregoing geometry may be understood more quickly by referring to the exploded view presented in FIG. 2 to which reference is briefly made. Lower housing section 7 contains vertical rear wall 19, vertical right and left side walls 21 and 23 and a horizontal bottom wall or floor 25. Table 3 is only partially illustrated in this view.

The rear walls 13 and 19 of each of the two sections contains a curved edge, 14 and 20, respectively defining a semicircular opening in the respective wall, and with the upper and lower section joined together the two openings form the circular opening illustrated. That circular opening allows the source flange cover (illustrated in dash lines) of the MBE chamber to fit into the opening and extend, at least partially, into the containment region when the containment system is assembled into place on the face of the MBE chamber, as later herein described. It should be recognized that in processing chambers that have source flange covers that are of a different size and/or shape than the foregoing circular opening, the size and/or shape of the opening formed in the rear walls of the two sections must be adjusted accordingly.

A gasket 27 is compressed between the confronting vertical wall edges of upper and lower housing sections 5 and 7. And a circular gasket 28 about the rear circular periphery of the opening is compressed between the sections and the face of the MBE chamber. Vertical members 22 and 24 are attached to the front of the upper housing section and form a sash frame. A rectangular-shaped metal closure or sash 26, illustrated by dash line and rendered transparent, is supported by the sash frame in a raised position overlying the front opening at the front of the containment system.

The sash is mounted for vertical movement up and down, much like opening and closing a house window, as hereafter described, and is sufficient in area to completely close the front opening of the containment system when the sash is lowered. When closed, the sash prevents escape of gas and other vapors from the front of the containment region and, as becomes apparent, the sash serves essentially the same function as the fire door in office buildings.

Upper housing section 5 supports a number of infra-red detectors 35 and 37, only two of which are pictorially illustrated, as part of the fire detection system. The upper housing section also contains the FWS spray nozzles 34 and 36, pictorially illustrated, which is part of the fire extinguishing system. To avoid unnecessary complexity in the figure, the wiring for the detectors and the conduit for the nozzles are not illustrated.

Figure 2:
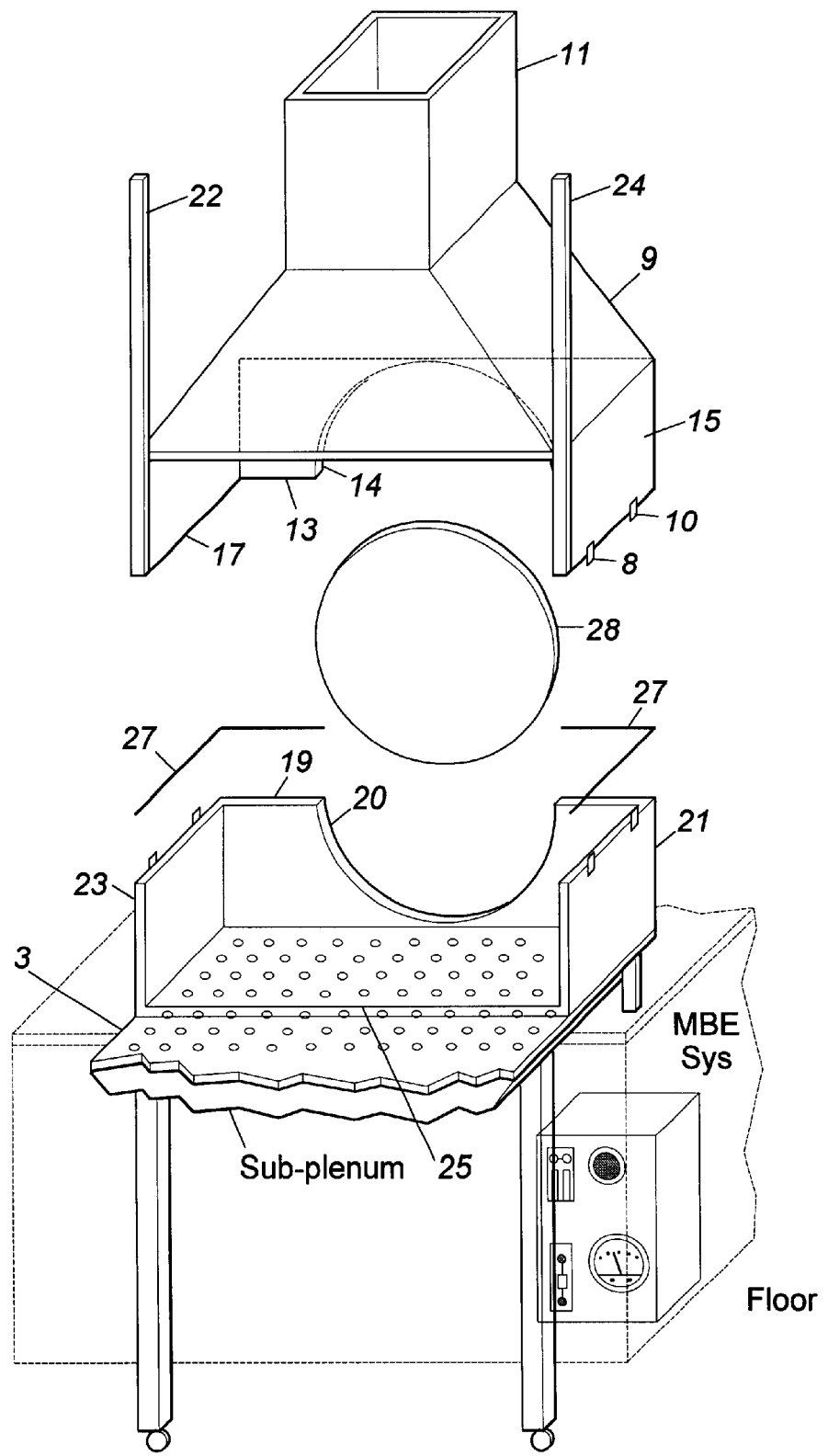
FIG. 2 is an exploded partial view of the embodiment of FIG. 1.

Bottom housing section 7 may also hold FWS spray nozzles, 38 and 40, pictorially illustrated. The bottom section also supports the rod-less pneumatic cylinder and pulley hardware and counter-balance weights for automatically raising or lowering the sash. The lower section also features a perforated table top and a removable sub-plenum to catch arsenic and/or phosphorus (shown in FIG. 2). A control enclosure as illustrated in FIG. 2 houses emergency power-off (EPO) switch, a panic switch for FWS activation; exhaust gauges and exhaust alarm and silence switches. The control enclosure also supports the manifold for hose, de-ionized water and nitrogen supply input.

Figure 3:
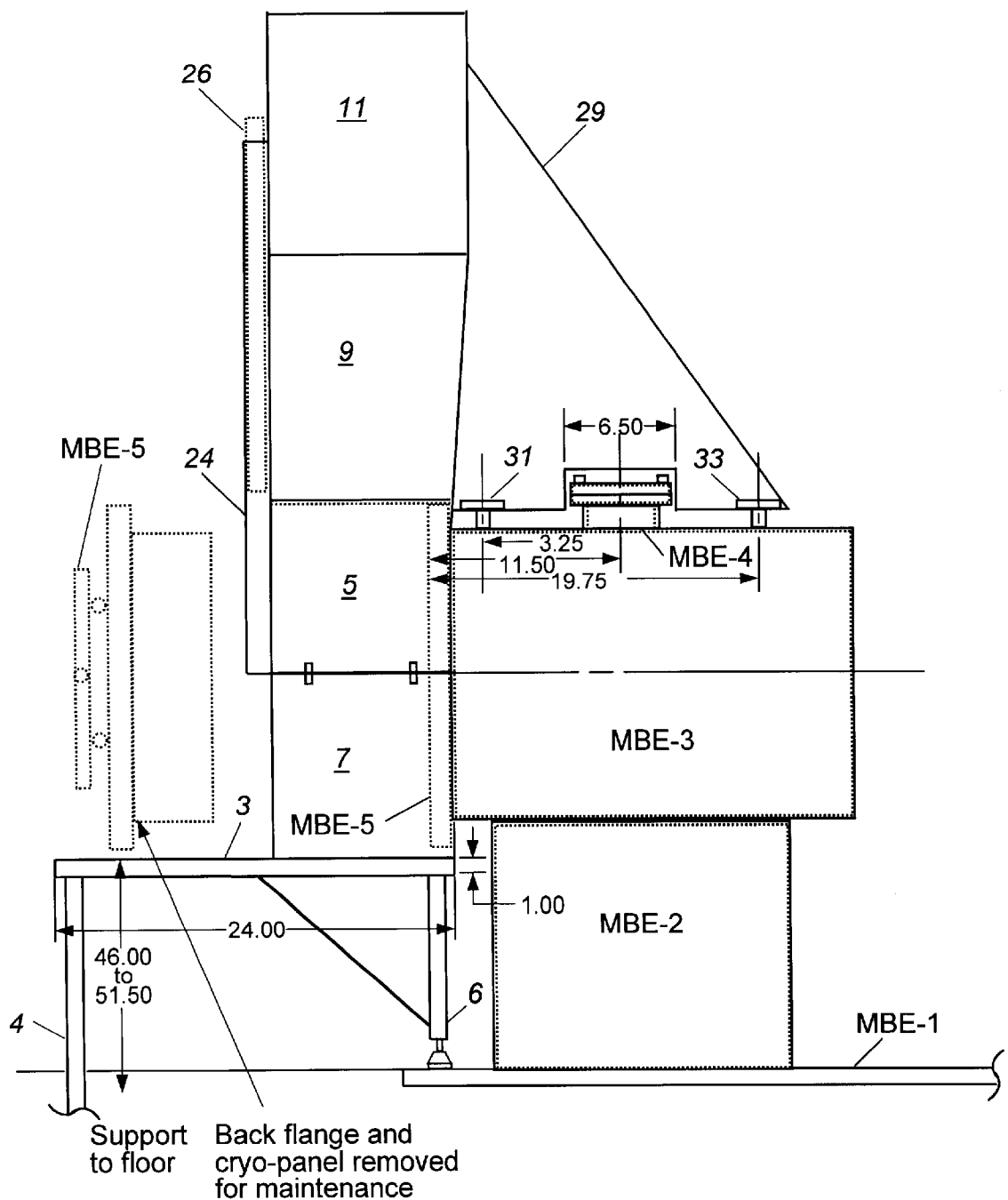
FIG. 3 shows the embodiment of FIG. 1 from the side.

In the side view of FIG. 3 to which reference is made, the containment system is illustrated as assembled and attached for operation to the MBE system, the latter represented in dash lines. The MBE system mechanically incorporates a system table top MBE1, a sub-chamber MBE2 located just below the growth chamber MBE3. The source flange MBE5 is illustrated in dash lines to indicate the position of that cover within the confinement region of the containment system. Upper housing section 5 includes a bracket 29 preferably formed from a sheet of stainless steel. The bracket is generally a right triangle in shape as illustrated.

The vertical wall of the bracket is welded to the rear side of the hood 9 and exhaust conduit 11. The bracket attaches to the upper surface of the MBE chamber by flanges on each side of the bracket, including flanges 31 and 33 on the bracket side visible in the figure. Those flanges are bolted into threaded bolt holes, not illustrated, formed in the top surface of the MBE chamber. Bracket 29 contains cut-out portions or openings along the horizontal edge to accommodate upwardly extending portions of the MBE chamber, such as the utility port MBE4, as might otherwise obstruct the bracket. The bracket provides additional support to prevent the containment system from tipping.

In this view, the side of the sash 26 and the normal position of that door is illustrated. Normally the door is supported in the upper position by appropriate counter balances, not illustrated, along the sash frame, both of which are of conventional known structure, not illustrated. A pneumatic rod-less cylinder, also not illustrated, connects to the door. When energized by the appropriate circuit, elsewhere herein described, the rod-less cylinder rapidly lowers the door to the closed position, closing the front access to the confinement region.

Perforated table 3 is greater in length than the depth of housing sections 5 and 7 to provide added surface for handling of the source flange cover MBE5, when that cover is extracted from the chamber wall. The table is supported by four legs, 4 and 6, two in the front and two in the back with only one of each visible in FIG. 3. The rear legs seat upon the system table top MBE1, which is vertically elevated from the floor of the facility in which the MBE chamber is housed, and, hence, are shorter than the front legs which extend to the floor of the facility.

A pair of latches 8 and 10 connect one side of the upper housing section to the lower housing section. A like pair of latches connect the other side of those housing sections together. The latches provide a convenient means to detach the sections when removing the unit for use with another MBE chamber in a different area of the facility.

The foregoing housing structure is constructed of a strong, impervious and generally non-reactive metal, such as stainless steel. In a practical embodiment of the foregoing, the bottom section is about 36 inches wide, 24 inches deep and 45 inches tall. The upper housing section is approximately the same size as the lower housing section, and is supported by the lower housing section and by the MBE system.

Figure 4:
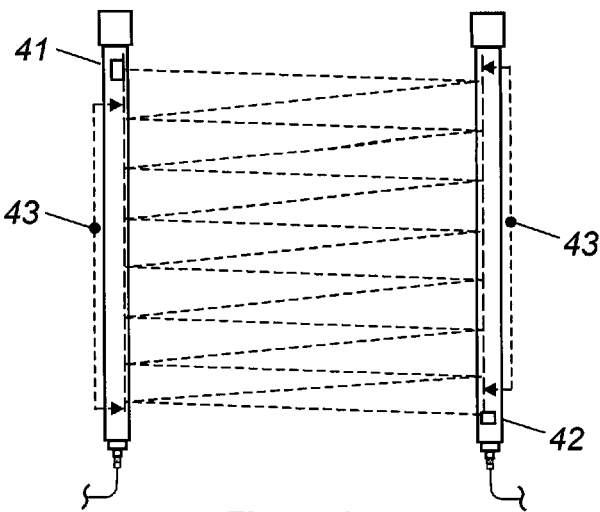
FIG. 4 pictorially illustrates a light curtain as may be used in the foregoing embodiment.

Reference is made to FIG. 4. The figure pictorially illustrates a conventional "light curtain" that is included in the periphery at the front of the containment system. As example such a system may include a collimated light source 41, located in the upper left of the housing section; a photo-detector 42; and a plurality of reflecting mirrors 43. The mirrors are adjusted to reflect the light from source 41 to detector 42 over a zig-zag path in a horizontal direction across the face of the front opening of the containment system. The foregoing elements were not earlier illustrated to avoid undue complication to FIGS. 1–3.

Should an appendage or other object be disposed in the plane of the light beams or be extending into containment region when the light curtain is activated, either or both light beams will be interrupted. That interruption serves as an indication of a person or object. The detection of such obstruction is used in the present system to prevent automatic closing of door 26, as later herein described in greater detail.

When the containment system is to be used with an MBE chamber, the table 3 is first placed in the position illustrated in FIG. 3 with the short rear legs seated atop the system table top. The circular gasket 28 is placed on the source flange cover MBE5. The bottom housing section 7 is then lifted onto the table and slid back against the face of the MBE chamber. The edge gaskets 27 are placed on the edges of the upstanding walls. Next the upper housing section is raised and lowered into place on top of the gaskets 27, compressing the gasket, and with the latch portions on the upper housing assembly aligned with the corresponding portions on the bottom portion; and the latches, including latches 8 and 10 are latched. The lower housing section and upper housing section are then bolted to the front of the MBE chamber, through threaded bolt holes in that apparatus, compressing the circular gasket 28 for a gas tight seal. Bracket 29 is bolted to the top surface of the MBE system. The exhaust tube 11 is connected to the facility exhaust, the manifold connections are made to the source of de-ionized water and nitrogen, and electricity is supplied to the control units. Disassembly of the system is undertaken in the reverse order.

The containment system is secured to the front face of the MBE chamber, suitably by bolts. Quick disconnect type interface connections, not illustrated, are preferably employed for the electrical sensors, the infra-red detectors. Quick-connect type hose couplings are preferably used for the de-ionized water, industrial nitrogen and fume exhaust ducts to connections for same that are maintained inside the facility in which the MBE chamber operates.

Figure 5:
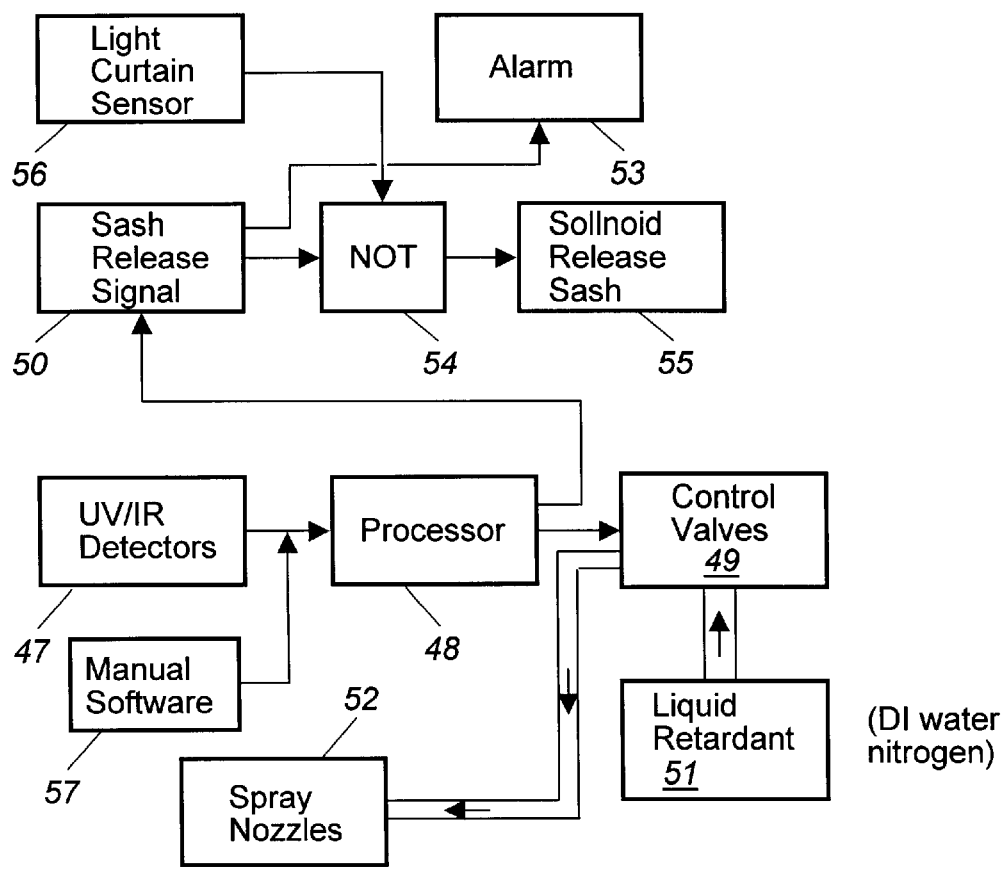
FIG. 5 is a block diagram illustrating the electrical operation of the various features of the foregoing embodiment.

As illustrated in the block diagram of FIG. 5, during operation, the UV/IR detectors, the fire detectors, generally represented by block 47 are focused to the floor of the containment region and monitor the region for evidence of a fire, even a fire that smolders. When a fire is detected, the detectors send a signal to the processor 48. The processor continues to monitor the output of the detectors for continued information of the fire for a period of time. So doing avoids unnecessary action in the event of a transient condition, such as a brief combustion that quickly extinguishes, or an electronic transient, as might produce a false alarm. Should the detection of fire persist, then the processor supplies an output signal to energize control valves 49 and another signal to the sash release signal generator 50. The valves open to allow de-ionized water and nitrogen from the in-house reservoir 51 and manifold of the containment system, through the conduit and through the spray nozzles, generally represented by block 52 (35 FIG. 1), which sprays the containment region with the de-ionized water and nitrogen. The sash release signal from 50 supplies a signal to an audible and visual alarm 53, which energizes to alert persons nearby of the problem. The sash release signal from 50 also sends a signal through a control gate, NOR gate 54, to the solenoid release sash 55, provided however that the NOR gate is not receiving the logic high signal from the light curtain sensor 56, the latter of which includes the electronic detection circuits associated with the light curtain of FIG. 4. The solenoid release sash energizes and lowers door 26 closing the front to the confinement region.

If at the time the sash release signal is generated, the attendant failed to remove his hand from within the containment region, the arm interrupts the light curtain. Light curtain sensor 50 signals the NOR gate 54 providing a high input. Because the second input to the gate is high, the gate cannot pass the sash release signal to the solenoid release sash 55, preventing the door from being lowered when the heavy door would impact the attendant's arm. The light current is also interrupted if an object is in the way, as would interfere with lowering the door. If the processor 48 does not receive a clear signal that the sash lowering signal is clear, an internal timer in the processor allows a ten second period to elapse before permitting valves 49 to open to dispense fire extinguishing media.

The control system may also include a manual switch 57 to permit operation of the dispensing valves 49 on demand. It is appreciated that the foregoing fire sensing circuits, fire extinguishing circuits, alarm circuits, light curtain circuits, and door operating mechanisms are individually old and known. They are included herein for completeness of the use of the new confinement system. As those skilled in the art understand from reading the foregoing description, the foregoing electrical and control systems may be varied in detail in many known ways without departing from the scope of the present invention.

The ideal circumstance for any kind of safety equipment is that the equipment stand ready, but is never required to be used. The foregoing containment system stands ready to protect the maintenance worker who cleans the MBE chamber. If care is taken and proper cleaning procedures are followed, ideally, a fire should not break out; and the containment system will not be called into action. If through an unfortuitous event a fire does break out, it is seen that the foregoing system confines and extinguishes the fire and prevents the person from the exposure to any of the products of combustion, such as toxic gas.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A containment system for an MBE chamber, said chamber including a front wall and an access port in said wall, said access port including a removable port cover, comprising:

a housing, said housing including a plurality of walls defining a containment region, said plurality of walls including a rear wall, a front access opening at the front of said housing to permit access to said confinement region from said front, and an exhaust vent tube for exhausting gas from said confinement region;

said rear wall including an opening for receiving at least a portion of said removable port cover within said containment region, whereby removal of said removable port cover provides access into said MBE chamber from said containment region;

a closure for said front access opening, said closure being movable between an opening position, whereby said front access opening is uncovered and a closed position, whereby said front access opening is closed; and fasteners for fastening said housing to said face of said MBE chamber with said port cover received within said opening in said rear wall.

2. The containment system as defined in claim 1, wherein said housing further comprises an upper housing section and a lower housing section; said upper housing section and said lower housing section being attached together to form said housing.

3. The containment system as defined in claim 2, further comprising: a plurality of latches for attaching said upper housing section to said lower housing section.

4. The containment system as defined in claim 3, further comprising:

a table for supporting said housing.

5. The containment system as defined in claim 4, further comprising:

a seal between said upper and lower housing sections.

6. The containment system as defined in claim 5, further comprising:

a second seal for sealing said periphery of said access opening of said MBE chamber to said rear wall of said housing.

7. The containment system as defined in claim 6, further comprising:

a sash frame located at a front of said housing for supporting said door; and wherein said door is movable between said open and closed positions by vertical movement in said sash frame.

8. The containment system as defined in claim 7, further comprising:

an infra-red detector, said fire detector being located in said housing for detecting any combustion in said confinement region; and a spray nozzle, said spray nozzle being located in said housing for spraying a fire extinguishing liquid into said confinement region.

9. The containment system as defined in claim 8, further comprising:

door closing means for moving said door to said closed position in response to detection of combustion by said infra-red detector.

10. The containment system as defined in claim 9, wherein said housing further includes a hood, and wherein said hood supports said exhaust vent tube; and a bracket attached to said hood and said exhaust vent tube for bracing said housing to a top surface of said MBE chamber.

11. The containment system as defined in claim 10, further comprising:

a light curtain supported at said front access opening in said housing for detecting the presence of an appendage or other obstruction at said front entry; and means for preventing said door from closing responsive to said light curtain detecting the presence of an appendage or other obstruction at said front entry.

* * * * *